United States Patent
Gupta et al.

(10) Patent No.: US 10,284,222 B1
(45) Date of Patent: May 7, 2019

(54) DELTA-SIGMA CONVERTER WITH PRE-CHARGING BASED ON QUANTIZER OUTPUT CODE

(71) Applicant: TEXAS INSTRUMENTS INCORPORATED, Dallas, TX (US)

(72) Inventors: Amit Kumar Gupta, Frisco, TX (US); Peng Cao, Richardson, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/121,906

(22) Filed: Sep. 5, 2018

Related U.S. Application Data

(60) Provisional application No. 62/628,305, filed on Feb. 9, 2018.

(51) Int. Cl.
*H03M 3/00* (2006.01)

(52) U.S. Cl.
CPC ........... *H03M 3/464* (2013.01); *H03M 3/422* (2013.01)

(58) Field of Classification Search
CPC .............................. H03M 3/464; H03M 3/422
USPC ........................................ 341/143, 155, 172
See application file for complete search history.

(56) References Cited

U.S. PATENT DOCUMENTS

| | | | |
|---|---|---|---|
| 5,057,839 A * | 10/1991 | Koch | H03M 3/47 341/143 |
| 8,907,829 B1 * | 12/2014 | Naderi | H03M 3/496 341/143 |

* cited by examiner

*Primary Examiner* — Khai M Nguyen
(74) *Attorney, Agent, or Firm* — John R. Pessetto; Charles A. Brill; Frank D. Cimino

(57) ABSTRACT

An analog-to-digital converter (ADC) device includes a delta-sigma modulator having at least one integrator and a quantizer configured to receive an output of the at least one integrator. The delta-sigma modulator also includes digital-to-analog converter (DAC) capacitor bank, a sampling capacitor bank, and a pre-charge capacitor bank, each selectively coupled to an input node of the at least one integrator. The delta-sigma modulator also includes a pre-charge signal generator coupled to the pre-charge capacitor bank. The pre-charge signal generator is configured to generate a pre-charge signal to charge the pre-charge capacitor bank based at least in part on an output code of the quantizer.

20 Claims, 4 Drawing Sheets

… (1)

DELTA-SIGMA CONVERTER WITH PRE-CHARGING BASED ON QUANTIZER OUTPUT CODE

RELATED APPLICATIONS

This application claims priority to U.S. Provisional Application No. 62/628,305, filed Feb. 9, 2018, titled "Delta-Sigma ADC Topology with Improved Input Impedance," which is incorporated herein by reference.

BACKGROUND

Different electrical systems or different components with an electrical system operate on analog signals or digital signals. Accordingly, there is an ongoing need to convert digital signals to analog signals and vice versa. In an analog-to-digital converter (ADC) scenario, an analog input signal is sampled, resulting in a representative digital value for each sample. Today, there are many different ADC device topologies and products available with variations in data rate, power consumption, accuracy, resolution, etc.

One type of ADC topology is referred to as a delta-sigma ($\Delta\Sigma$) topology. In a $\Delta\Sigma$ topology, the input signal is over-sampled by a $\Delta\Sigma$ modulator and the output of the $\Delta\Sigma$ modulator is passed through a digital/decimation filter to produce a high-resolution data-stream output. The sampling rate is typically hundreds of times faster than the digital output of the digital/decimation filter. Accordingly, in a $\Delta\Sigma$ topology, individual samples are accumulated over time and "averaged" with the other input-signal samples through the digital/decimation filter.

When an ADC device is included as part of a larger electrical system, the effect of loading by the ADC input on the source needs to be accounted for. In an example electrical system, sensors are employed along with ADC devices to convert analog output signals of the sensors to digital signals for storage and/or analysis. To help ensure an ADC device is compatible with input signals coming from a source with high output impedance (e.g., a scenario where analog output signals from a passive sensor with high output impedance are the input signals to an ADC device), some ADC device topologies include buffers to amplify or otherwise prepare input signals for sampling. Unfortunately, buffer-based ADC device topologies increase ADC cost and layout size. Buffers also increase power consumption and add to the ADC noise. For ADC scenarios involving an input signal with high source impedance, simply removing the buffers is not a workable solution. Efforts to improve ADC design and provide marketable ADC devices are ongoing.

SUMMARY

In accordance with at least one example of the disclosure, an analog-to-digital converter (ADC) device comprises a delta-sigma modulator having at least one integrator and a quantizer configured to receive an output of the at least one integrator. The delta-sigma modulator also comprises a digital-to-analog converter (DAC) capacitor bank, a sampling capacitor bank, and a pre-charge capacitor bank, each selectively coupled to an input node of the at least one integrator. The delta-sigma modulator also comprises a pre-charge signal generator selectively coupled to the pre-charge capacitor bank. The pre-charge signal generator is configured to generate a pre-charge signal to charge the pre-charge capacitor bank based at least in part on an output code of the quantizer.

In accordance with at least one example of the disclosure, an ADC device comprises a delta-sigma modulator having an integrator and a pre-charge circuit coupled to an input of the integrator. The pre-charge circuit comprises a pre-charge capacitor with a first terminal coupled to the integrator and a second terminal coupled to a pre-charge signal node via a switch. During a first portion of a sampling phase for the delta-sigma modulator, the pre-charge signal node is configured to convey a pre-charge signal to the pre-charge capacitor, wherein the pre-charge signal is based at least in part on a quantizer output code associated with the delta-sigma modulator. During a second portion of the sampling phase for the delta-sigma modulator, the pre-charge capacitor is coupled to an input signal node.

In accordance with at least one example of the disclosure, an ADC method comprises receiving an analog input signal. The method also comprises producing an output code related to the analog input signal based on a delta-sigma modulator sampling phase and integration phase. The method also comprises generating a pre-charge signal based on the output code. The method also comprises performing a pre-charge operation for a subsequent delta-sigma modulator sampling phase based on the generated pre-charge signal.

BRIEF DESCRIPTION OF THE DRAWINGS

For a detailed description of various examples, reference will now be made to the accompanying drawings in which.

DETAILED DESCRIPTION

The disclosed examples are directed to delta-sigma ($\Delta\Sigma$) analog-to-digital converter (ADC) topologies, devices, and methods that employ pre-charging based on quantizer output code. An example delta-sigma ADC topology includes a delta-sigma modulator and a filter. More specifically, an example delta-sigma modulator includes a sampling circuit, one or more integrators, a quantizer, and a digital-to-analog converter (DAC), where the DAC output is combined with the analog input signal to be sampled. In the example delta-sigma ADC topology, the output code from the quantizer is used for pre-charging operations as described herein. The output code is also provided to the filter, and the filter output corresponds to the ADC output.

In at least some examples, the pre-charging process involves generating a pre-charge signal based on the quantizer output code and a reference voltage (e.g., pre-charge signal=bit-stream*reference voltage). Also, in some examples, the pre-charge signal is weighted to account for system/component variations (e.g., pre-charge signal=bit-stream*reference voltage*weighting factor). The generated pre-charge signal is applied to a pre-charge capacitor bank (e.g., by coupling the pre-charge capacitor bank to a pre-charge signal node) during a first portion of a delta-sigma modulator's sampling phase. In a second portion of the delta-sigma modulator's sampling phase, the pre-charge capacitor bank is coupled to an analog input signal node instead of the pre-charge signal node. The charge transfer from the analog input signal node during the first portion of the delta-sigma modulator's sampling phase is on average equal to charge returned from the pre-charge capacitor bank to the analog input signal node in the second portion of the delta-sigma modulator's sampling phase. Accordingly, use of a pre-charge capacitor bank and strategic switching during a delta-sigma modulator's sampling phase (e.g., switching from being coupled to a pre-charge signal node in a first portion of the sampling phase to being coupled to an analog input signal node in a second portion of the sampling phase) reduces the average current drawn at the analog input signal node, resulting in a delta-sigma ADC topology with a higher input impedance compared to a delta-sigma ADC topology without pre-charging. The pre-charge scheme described herein works for a delta-sigma modulator with a single-bit quanitzer or a multi-bit quantizer. To provide a better understanding, various ADC module, device, and method options involving pre-charging based on a bit-stream (single-bit quantizer) are described using the figures as follows.

Figure 1:
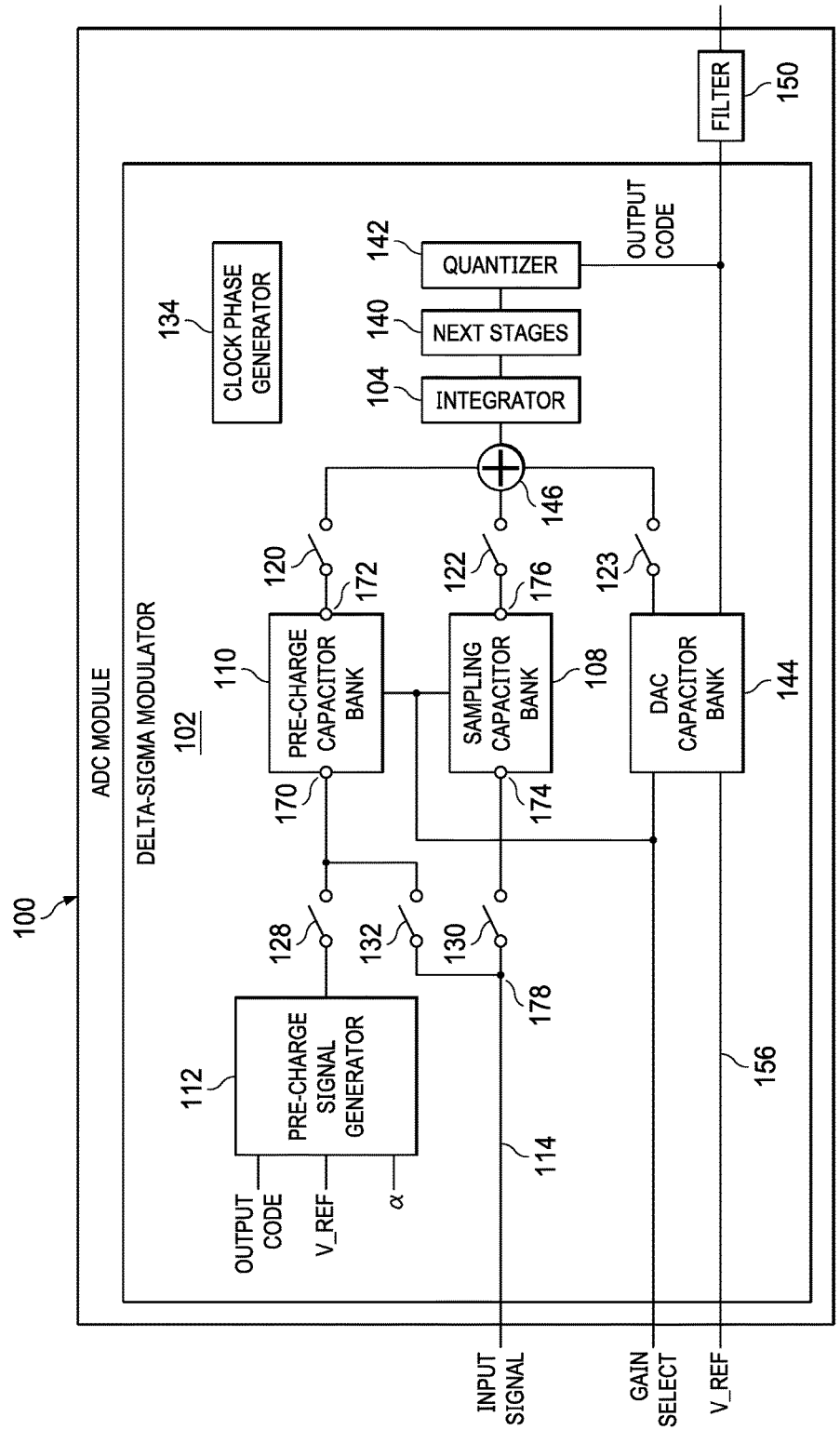
FIG. 1 shows a block diagram of an analog-to-digital converter (ADC) module in accordance with various examples.

FIG. 1 shows a block diagram of an ADC module 100 in accordance with various examples. As shown, the ADC module 100 comprises a delta-sigma modulator 102 coupled to a filter 150. More specifically, the delta-sigma modulator 102 comprises an integrator 104. The output of the integrator 104 is provided to an optional next stage(s) block 140 that performs additional integration stages. In some examples, the delta-sigma modulator 102 employs one integration stage. In other examples, the delta-sigma modulator 102 employs two or more integration stages. The output from the integrator 104 or the next stage(s) block 140 is provided to a quantizer 142, which produces a digital output code. In some examples, the quantizer 142 is a comparator that outputs a positive or negative value depending on the sign (+ or −) of the input to the quantizer 142. The output code from the quantizer 142 is provided to a filter 150 that filters and downsamples the output code from the quantizer 142 to provide an output for the ADC module 100. For a single-bit quantizer using a single comparator, the output code is typically referred as a bit-stream.

The output code from the quantizer 142 is also provided to a pre-charge signal generator 112. For single-bit examples, the pre-charge signal generator 112 operates to generate a pre-charge signal by multiplying the bit-stream by a reference voltage (V_REF) for the ADC module 100. As desired, a weighting factor (α) is also applied by the pre-charge signal generator 112 (e.g., pre-charge signal=bit-stream*V_REF*α). The pre-charge signal is applied to a pre-charge capacitor bank 110 via a switch 128. In different examples, the pre-charge capacitor bank 110 includes one capacitor or a plurality of capacitors in parallel. In some examples, the pre-charge capacitor bank 110 also includes switches to vary which of the parallel capacitors are coupled to its input node 170 and output node 172. In one example, the different combinations of parallel capacitors for the pre-charge capacitor bank 110 are selected based on an adjustable (programmable) gain select signal.

As represented in FIG. 1, the delta-sigma modulator 102 also includes a sampling capacitor bank 108. In different examples, the sampling capacitor bank 108 includes one capacitor or a plurality of capacitors in parallel. In some examples, the sampling capacitor bank 108 also includes switches to vary which of the parallel capacitors are coupled to its input node 174 and output node 176. In one example, the different combinations of parallel capacitors for the sampling capacitor bank 108 are selected based on an adjustable (programmable) gain select signal.

During a sampling phase of the delta-sigma modulator 102, a switch 130 closes to provide an analog input signal at the analog input signal node 178 to the sampling capacitor bank 108. In at least some examples, delta-sigma feedback is provided by a DAC capacitor bank 144 in the feedback loop for the delta-sigma modulator 102. During the sampling phase, the sampling capacitor bank 108 is charged based on the analog input signal. In addition, during a first portion of the sampling phase, the switch 128 closes to enable charging of the pre-charge capacitor bank 110 based on the pre-charge signal provided by the pre-charge signal generator 112.

During a second portion of the sampling phase, the switch 130 stays closed, the switch 128 opens, and the switch 132 closes. Accordingly, in the second portion of the sampling phase, the pre-charge capacitor bank 110 couples to the analog input signal node 178 while switch 130 is closed, resulting in at least some of the charge acquired by the pre-charge capacitor bank 110 in the first portion of the sampling phase being passed to analog input signal line 114.

In an integration phase of the delta-sigma modulator 102, the switches 128, 130, and 132 are open. Meanwhile, switches 120, 122 and 123, which are open during the sampling phase, are closed during the integration phase. For the integration phase, the integrator 104 is coupled to the sampling capacitor bank 108, DAC capacitor bank 144, and the pre-charge capacitor bank 110 (e.g., by closing switches 120, 122 and 123). In operation, the integrator 104 shifts quantization noise to higher frequencies for later removal by the filter 150.

In FIG. 1, the various switches (e.g., switches 120, 122, 123, 128, 130, 132) are directed by a delta-sigma modulator clock phase generator 134 that provides on/off control signals to each switch based on the different modulator phases described previously (e.g., the integration phase, the sampling phase, the first portion of the sampling phase, the second portion of the sampling phase). Thus, the different switches correspond to sampling phase switches (e.g., switches 128 and 130 are closed during the sampling phase), integration phase switches (e.g., switches 120, 122, and 123 are closed during the integration phase), first portion sampling phase switches (e.g., switch 128 is closed during the first portion of the sampling phase), and second portion sampling phase switches (e.g., switch 132 is closed during the second portion of the sampling phase).

In some examples, the operations of delta-sigma modulator components (e.g., the clock phase generator 134) and/or other components of the ADC module 100 are adjustable based on external control signals 152 provided to the ADC module 100 and/or stored instructions. In one example, the timing of the sampling phase, the first portion of the sampling phase, the second portion of the sampling phase, and the integration phase for the delta-sigma modulator 102 are adjustable. Also, in some examples, the ADC module 100 with the delta-sigma modulator 102 and filter 150 are employed in a differential signaling scenario.

Figure 2:
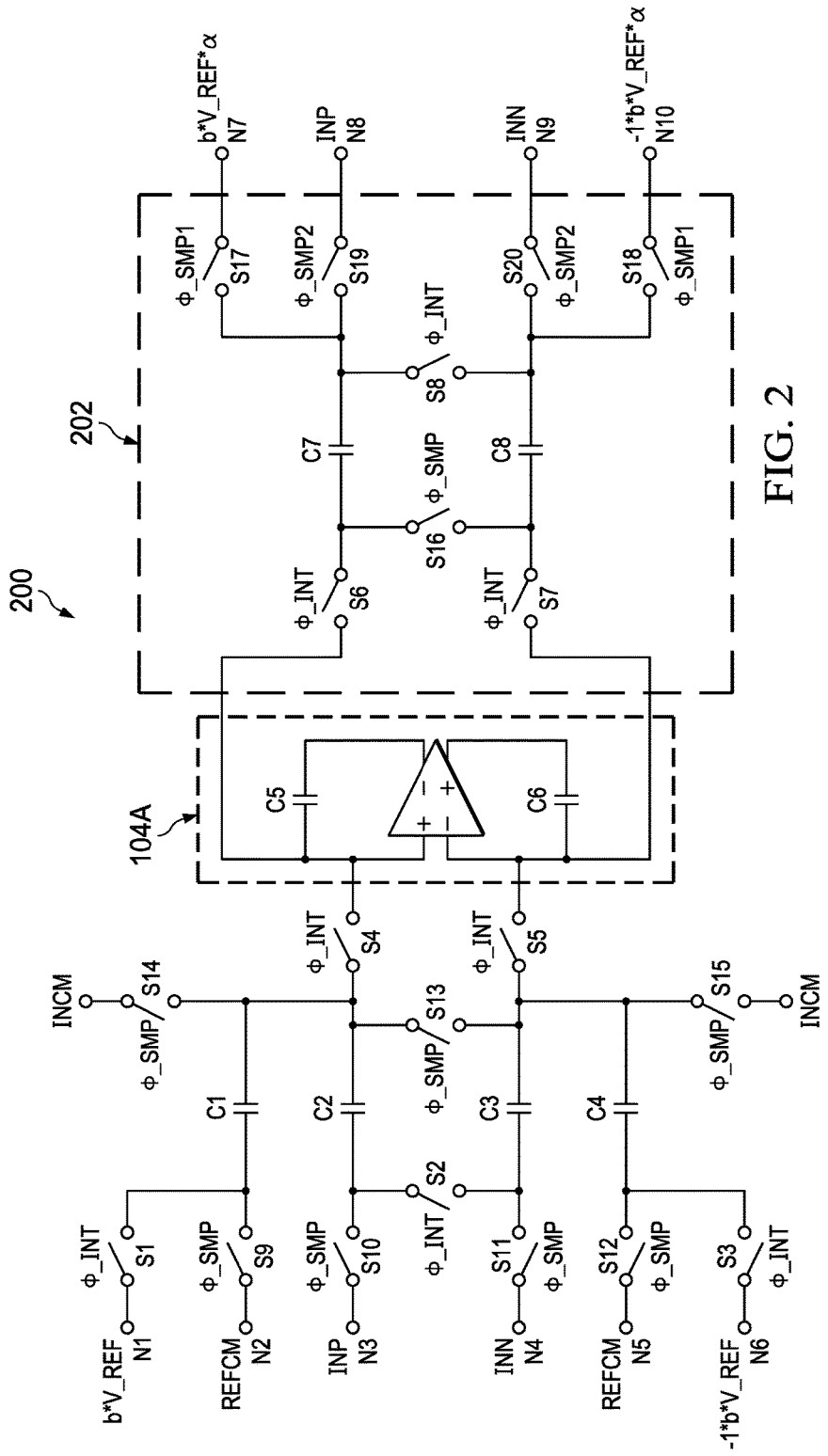
FIG. 2 shows a schematic diagram of various components for a delta-sigma modulator in accordance with various examples.

FIG. 2 shows a schematic diagram of various components for a delta-sigma modulator 200 (e.g., the delta-sigma modulator 102 of FIG. 1) in accordance with various examples. More specifically, the components for the delta-sigma modulator 200 are arranged for a differential signaling scenario. As shown, the delta-sigma modulator 200 includes a differential integrator 104A (an example of integrator 104 in FIG. 1), various capacitors (C1-C8), various switches (S1-S20), and various signal nodes (N1-N10). For the delta-sigma modulator 200, pre-charge operations are based on a bit-stream as described herein. An explanation of the relationship between the components represented for the delta-sigma modulator 200 of FIG. 2 and the various components represented for the delta-sigma modulator 102 of FIG. 1 is given below.

In FIGS. 2, C2 and C3 correspond to components of a sampling capacitor bank (see e.g., the sampling capacitor bank 108 in FIG. 1), C1 and C4 correspond to components of a DAC capacitor bank (see e.g., the DAC capacitor bank 144 in FIG. 1), and C7 and C8 correspond to pre-charge capacitor bank components (see e.g., the pre-charge capacitor bank 110 in FIG. 1). Also, S1-S8 correspond to integration phase switches (see e.g., switches 120, 122, and 123 in FIG. 1), S9-16 correspond to sampling phase switches (see e.g., switch 130 in FIG. 1), S17 and S18 correspond to first portion sampling phase switches (see e.g., switch 128 in FIG. 1), and S19 and S20 correspond to second portion sampling phase switches (see e.g., switch 132 in FIG. 1).

During the sampling phase of the delta-sigma modulator 200, various capacitors are charged or discharged using a sampling phase control signal (ϕ_SMP) as follows. When S9 is closed during the sampling phase, C1 couples to N2, resulting in C1 being charged based on a signal REFCM (a common-mode reference) available at N2. When S10 is closed during the sampling phase, C2 couples to N3, resulting in C2 being charged based on a signal INP (a first differential analog input signal) available at N3. When S11 is closed during the sampling phase, C3 couples to N4, resulting in C3 being charged based on a signal INN (a second differential analog input signal) available at N4. When S2 is closed during the sampling phase, C4 couples to N5, resulting in C4 being charged based on a signal REFCM (a common-mode reference corresponding to an ADC reference voltage) available at N5. When S14 and S15 are closed during the sampling phase, a common-mode signal (INCM, corresponding to an input common mode for the integrator 104A) is provided to respective terminals of C1-C4. When S16 is closed during the sampling phase, respective terminals of C7 and C8 are coupled together.

During the sampling phase, a first portion of sampling phase control signal (ϕ_SMP1) is used to control various pre-charge operations. More specifically, when S17 is closed during a first portion of the sampling phase, C7 couples to N7, resulting in C7 being charged based on a signal $b*V\_REF*\alpha$ available at N7. Also, when S18 is closed during a first portion of the sampling phase, C8 couples to N10, resulting in C8 being charged based on a signal $-1*b*V\_REF*\alpha$ available at N10. For a single bit modulator b can be +1 or −1. For a modulator with an N-bit quantizer, the output code (OC) varies from $-2^{N-1}$ to $+2^{N-1}$. In such case, the pre-charge signal on N7 is $OC*V\_REF*\alpha*2^{1-N}$ and the pre-charge signal on N10 is $-1*OC*V\_REF*\alpha*2^{1-N}$.

In FIGS. 2, C1 and C4 represent a single-bit feedback DAC (an example of the DAC capacitor bank 144 in FIG. 1) with a single unit element. For an N-bit quantizer the feedback DAC (an example of the DAC capacitor bank 144 in FIG. 1) needs to be N bit with $2^N$ unit elements. In the 1-bit quantizer represented in FIGS. 2, C1 and C4 and respective switches S1, S9, S12, and S3 are used for single-bit operation. For a 2-bit quantizer, C1 would be replaced with four identical capacitors and related switches would be used. C4 being the differential counterpart of C1 would be similarly replaced with four identical capacitors and related switches would be used. For a 3-bit quantizer, each of C1 and C4 will be replaced with 8 capacitors and related switches, and so on. In at least some examples, pre-charge capacitor bank components are a replication of DAC capacitor bank components. So for an N-bit quantizer, a respective pre-charge capacitor bank (e.g., the pre-charge capacitor bank 110 would have $2^N$ unit elements which are pre-charged using the same output code and reference going to the feedback DAC.

As noted previously, the pre-charge signal is adjustable based on a. For an ideal circuit, α=1. In real circuit design, the finite charge injection and clock feedthrough from switches leads to some additional charge being transferred to the input source and a needs to be adjusted to achieve very high impedance.

Later in the sampling phase, a second portion of sampling phase control signal (ϕ_SMP2) is used to complete pre-charge operations. More specifically, when S19 is closed during a second portion of the sampling phase, C7 couples to N8 (a first differential analog input signal node), resulting in C7 discharging its charge from the first portion of the sampling phase to N8 (note: N3 and N8 are the same or are coupled together). Similarly, when S20 is closed during a second portion of the sampling phase, C8 couples to N9 (a second differential analog input signal node), resulting in C8 discharging its charge from the first portion of the sampling phase to N9 (note: N4 and N9 are the same or are coupled together).

Figure 3:
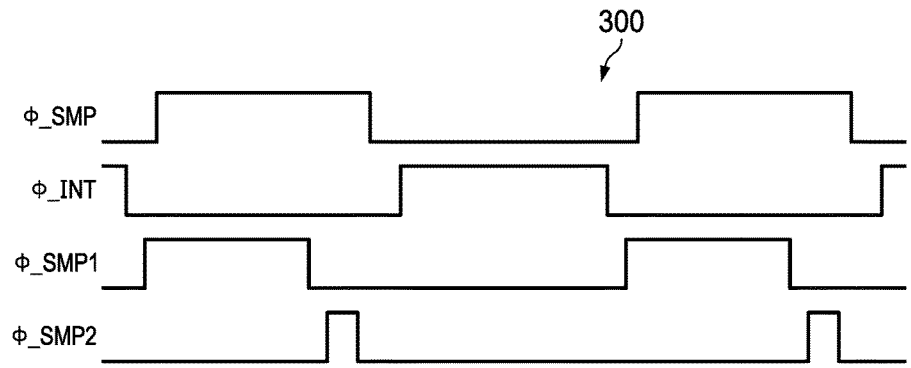
FIG. 3 shows a timing diagram of control signals for a delta-sigma modulator in accordance with various examples.

During the integration phase of the delta-sigma modulator 200, various capacitors are charged or discharged using an integration phase control signal (ϕ_INT) as follows. When S1 is closed during the integration phase, C1 couples to N1, resulting in C1 being charged based on a signal $b*V\_REF$ available at N1. When S3 is closed during the integration phase, C4 couples to N6, resulting in C4 being charged based on a signal $-1*b*V\_REF$ available at N6. When S1, S2, S3, S4, and S5 are closed during the integration phase, C1-C4 provide their respective charges to the differential integrator 104A. Likewise, when S6, S7, and S8 are closed during the integration phase, C7 and C8 provide their respective charges to the differential integrator 104A. FIG. 3 shows a timing diagram 300 of control signals for a delta-sigma modulator in accordance with various examples. As shown, the control signals include ϕ_SMP, ϕ_INT, ϕ_SMP1, and ϕ_SMP2 introduced in FIG. 2. For the timing diagram 300, a high-state for each control signal corresponds to closing a related switch or switches, and a low-state for each control signal corresponds to opening a related switch or switches. As shown in the timing diagram 300, when ϕ_SMP is in a high-state, ϕ_INT is in a low state and vice versa. Likewise, when ϕ_SMP1 is in a high-state, ϕ_INT is in a low state and vice versa. Likewise, when ϕ_SMP2 is in a high-state, ϕ_INT is in a low state and vice versa. In at least some examples, there is some offset between edges of ϕ_INT and the other control signals ϕ_SMP, ϕ_SMP1, ϕ_SMP2). As shown, a high-state for ϕ_SMP1 overlaps with a first portion of the high-state for ϕ_SMP. Also, a high-state for ϕ_SMP2 overlaps with a second portion of the high-state for ϕ_SMP. ϕ_SMP1 and ϕ_SMP2 are non-overlapping signals.

Figure 4:
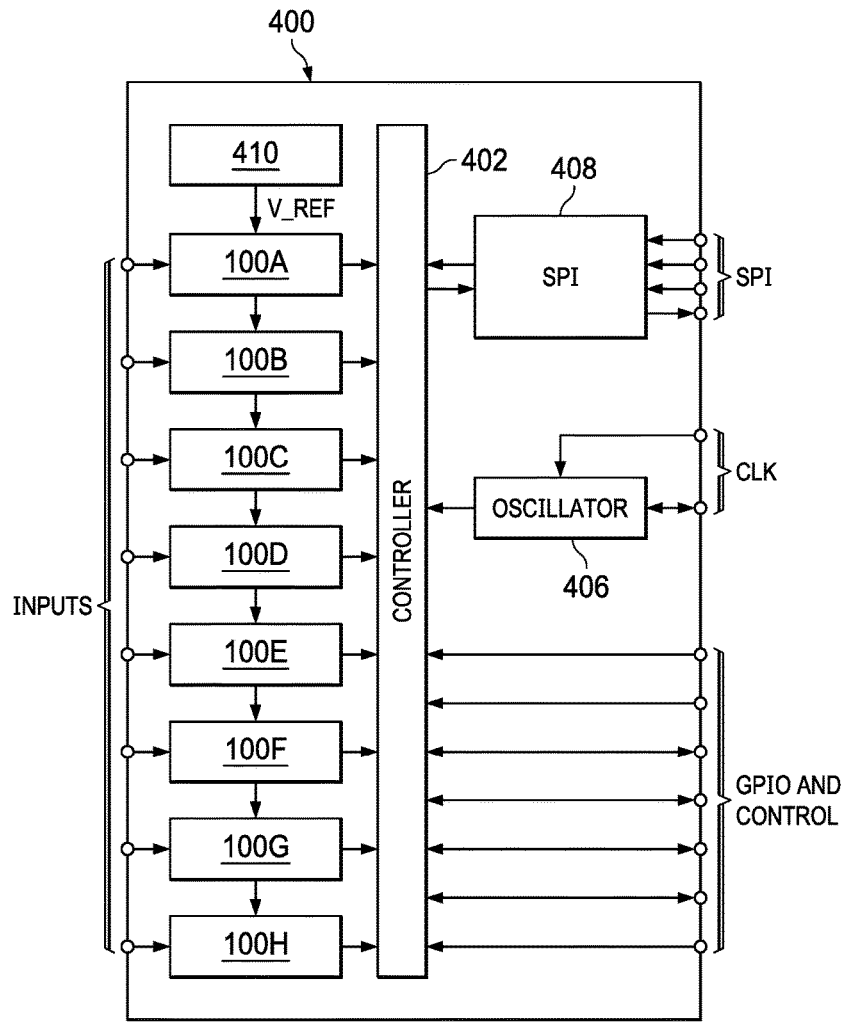
FIG. 4 shows a block diagram of an ADC device in accordance with various examples.

FIG. 4 shows a block diagram of an ADC device 400 in accordance with various examples. As shown, the ADC device includes various ADC modules 100A-100H, where each of the ADC modules 100A-100H is an example of the ADC module 100 of FIG. 1. In different ADC device examples, the number of ADC modules varies. The ADC device 400 also includes various components, including a voltage reference to provide V_REF where V_REF is provided to each of the modules 100A-100H. Each of the ADC modules 100A-100H operates to digitize an analog input received via respective signal lines. In the example of FIG. 4, the MUX 404 routes internal and/or external signals to the ADC channel. In other examples, the MUX 404 is omitted. The ADC device 400 also includes a controller 402 that receives, stores, and/or analyses the digital outputs from the ADC modules 100A-100H. In different examples, the operations and clock rate (based on oscillator 406) of the controller 402 varies. To communicate with other components via digital signaling, the ADC device 400 includes a serial peripheral interface (SPI) and various inputs/outputs (labeled GPIO and control in FIG. 4).

In some examples, the ADC device 400 is used to digitize analog sensor outputs. As desired, the digitized sensor outputs are stored and analyzed by the controller 402, or are conveyed to external storage and/or processing components. With the topology and pre-charge operations for each of the ADC modules 100A-100H, input signal buffers are avoided. Avoiding input signal buffers reduces the size and cost of the ADC device 400. Also, pre-charge operations based on a bit-stream result in the ADC modules 100A-100H having a higher input-impedance compared to other ADC device topologies. With a higher input-impedance for the ADC modules 100A-100H, the ADC device 400 is usable in scenarios where impedance of source connected to the ADC device 400 (e.g., analog sensor output signals from passive sensors) is high.

Figure 5:
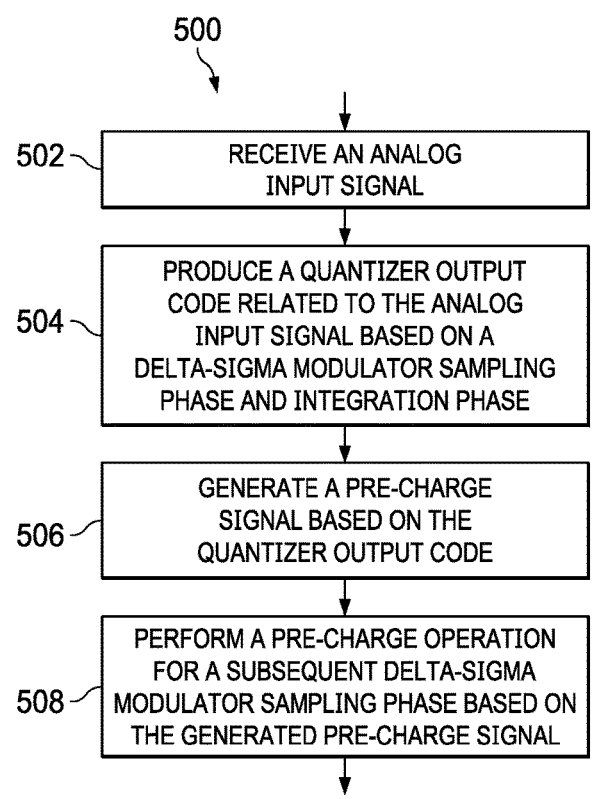
FIG. 5 shows a flowchart of an ADC method in accordance with various examples.

FIG. 5 shows a flowchart of an ADC method 500 in accordance with various examples. As shown, the ADC method 500 comprises receiving an analog input signal at block 502. At block 504, a quantizer output code related to the analog input signal is produced based on a delta-sigma modulator sampling phase (e.g., $\phi$_SMP) and integration phase (e.g., $\phi$_INT). At block 506, a pre-charge signal is generated based on the quantizer output code. In some examples, generating the pre-charge signal at block 506 involves multiplying the quantizer output code by a reference voltage (e.g., OC*V_REF). In other examples, generating the pre-charge signal at block 506 involves multiplying the quantizer output code by a reference voltage and a weighting factor (e.g., OC*V_REF*$\alpha$). Note: generating the pre-charge signal at block 506 is a separate process from the operations of the delta-sigma modulator DAC.

At block 508, a pre-charge operation for a subsequent delta-sigma modulator sampling phase is performed based on the generated pre-charge signal. In some examples, the pre-charge operation of block 508 comprises closing a first set of switches (e.g., switch 128 in FIG. 1, or S17, S18 in FIG. 2) associated with a pre-charge capacitor bank (e.g., 110) during a first portion of a sampling phase (e.g., $\phi$_SMP1) to charge the pre-charge capacitor bank (e.g., the pre-charge capacitor bank 110) based on the pre-charge signal. In some examples, the pre-charge operation of block 508 also comprises opening the first set of switches (e.g., switch 128 in FIG. 1, or S17, S18 in FIG. 2) during a second portion of the sampling phase (e.g., $\phi$_SMP2), and closing a second set of switches (e.g., switch 132 in FIG. 1, or S19, S20 in FIG. 2) associated with the pre-charge capacitor bank (e.g., the pre-charge capacitor bank 110) during the second portion of the sampling phase (e.g., $\phi$_SMP2) to discharge the pre-charge capacitor bank to an analog input signal node (e.g., 178 in FIG. 1, or N8 and N9 in FIG. 2).

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. In some examples, the pre-charging operations described herein (pre-charging based on output code) are applied to ADC scenarios that do not employ a delta-sigma modulator. It is intended that the following claims be interpreted to embrace all such variations and modifications.

What is claimed is:

1. An analog-to-digital converter (ADC) device that comprises:
   a delta-sigma modulator having:
      at least one integrator;
      a quantizer configured to receive an output of the at least one integrator;
      a digital-to-analog converter (DAC) capacitor bank, a sampling capacitor bank, and a pre-charge capacitor bank, each selectively coupled to an input node of the at least one integrator; and
   a pre-charge signal generator selectively coupled to the pre-charge capacitor bank,
      wherein the pre-charge signal generator is configured to generate a pre-charge signal to charge the pre-charge capacitor bank based at least in part on an output code of the quantizer.

2. The ADC device of claim 1, wherein the pre-charge signal generator is configured to generate the pre-charge signal by combining the output code of the quantizer with a reference voltage.

3. The ADC device of claim 1, wherein the pre-charge signal generator is configured to generate the pre-charge signal based on a weighting factor.

4. The ADC device of claim 3, wherein the weighting factor is a predetermined value.

5. The ADC device of claim 3, wherein the weighting factor is adjustable.

6. The ADC device of claim 3, wherein the pre-charge signal is given as:
   pre-charge signal=(quantizer output code*a reference voltage*the weighting factor)/$2^N$ where N depends on a number of bits in the quantizer.

7. The ADC device of claim 1, wherein the pre-charge capacitor bank comprises a plurality of pre-charge capacitors in parallel between an input node and an output node, wherein a quantity of the plurality of pre-charge capacitors coupled in parallel between the input node and the output node of the pre-charge capacitor bank is adjustable.

8. The ADC device of claim 7, wherein the quantity of pre-charge capacitors coupled in parallel between the input node and the output node of the pre-charge capacitor bank is adjusted based on a programmable gain signal.

9. The ADC device of claim 1, wherein the sampling capacitor bank comprises a plurality of sampling capacitors in parallel between an input node and an output node, wherein a quantity of sampling capacitors coupled in parallel between the input node and the output node of the sampling capacitor bank is adjustable.

10. The ADC device of claim 1, wherein the quantity of sampling capacitors coupled in parallel between the input node and the output node of the sampling capacitor bank is adjusted based on a programmable gain signal.

11. The ADC device of claim 10, further comprising a clock phase generator configured to direct selective coupling of the pre-charge capacitor bank to each input node of the at least one integrator, and selective coupling of the sampling capacitor bank to each input node of the at least one integrator.

12. An analog-to-digital converter (ADC) device that comprises:
    a delta-sigma modulator having an integrator and a pre-charge circuit coupled to an input of the integrator, wherein the pre-charge circuit comprises:
        a pre-charge capacitor with a first terminal coupled to the integrator and a second terminal coupled to a pre-charge signal node via a switch;
        wherein, during a first portion of a sampling phase for the delta-sigma modulator, the pre-charge signal node is configured to convey a pre-charge signal to the pre-charge capacitor, wherein the pre-charge signal is based at least in part on a quantizer output code associated with the delta-sigma modulator,
        wherein, during a second portion of the sampling phase for the delta-sigma modulator, the pre-charge capacitor couples to an input signal node.

13. The ADC device of claim 12, wherein the integrator is a differential integrator, the capacitor is a first capacitor, the pre-charge signal node is a first pre-charge signal node, the pre-charge signal is a first pre-charge signal, and the switch is a first switch, wherein the pre-charge circuit further comprises:
    a second pre-charge capacitor with a first terminal coupled to the differential integrator and a second terminal coupled to a second pre-charge signal node via a second switch,
    wherein the second pre-charge signal node is configured to convey a second pre-charge signal based on the at least in part on the quantizer output code, and
    wherein the second switch is configured to selectively charge the second pre-charge capacitor using the second pre-charge signal.

14. The ADC device of claim 13, wherein the pre-charge circuit further comprises:
    a third switch coupled between a first differential input signal node and the second terminal of the first capacitor; and
    a fourth switch coupled between a second differential input signal node and the second terminal of the second capacitor,
    wherein the first and second differential input signal nodes are configured to convey respective first and second differential input signals,
    wherein the third switch is configured to selectively charge the first capacitor using the first differential input signal, and
    wherein the fourth switch is configured to selectively charge the second capacitor using the second differential input signal.

15. The ADC device of claim 14, wherein the first and second switches are open during an integration phase of the delta-sigma modulator and are closed during a first portion of a sampling phase of the delta-sigma modulator, and wherein the third and fourth switches are open during the integration phase of the delta-sigma modulator and are closed during a second portion of the sampling phase of the delta-sigma modulator.

16. The ADC device of claim 14, wherein the pre-charge circuit further comprises:
    a fifth switch coupled to the second terminals of the first and second capacitors;
    a sixth switch coupled between the first terminal of the first capacitor and the differential integrator; and
    a seventh switch coupled between the first terminal of the second capacitor and the differential integrator, wherein the fifth, sixth, and seventh switches are open during a sampling phase of the delta-sigma modulator and are closed during an integration phase of the delta-sigma modulator.

17. The ADC device of claim 16, wherein the pre-charge circuit further comprises:
    an eighth switch between the first terminals of the first and second capacitors, wherein the eighth switch is open during an integration phase of the delta-sigma modulator, and wherein the eighth switch is closed during a sampling phase of the delta-sigma modulator.

18. An analog-to-digital converter (ADC) method that comprises:
    receiving an analog input signal;
    producing an output code related to the analog input signal based on a delta-sigma modulator sampling phase and integration phase;
    generating a pre-charge signal based on the output code; and
    performing a pre-charge operation for a subsequent delta-sigma modulator sampling phase based on the generated pre-charge signal.

19. The ADC method of claim 18, wherein generating the pre-charge signal comprises multiplying the output code by a reference voltage supply signal and a weighting factor.

20. The ADC method of claim 18, wherein performing the pre-charge operation comprises:
    closing a first set of switches associated with a pre-charge capacitor bank during a first portion of the sampling phase to charge the pre-charge capacitor bank based on the pre-charge signal;
    opening the first set of switches during a second portion of the sampling phase; and
    closing a second set of switches associated with the pre-charge capacitor bank during the second portion of the sampling phase to discharge the pre-charge capacitor bank to an analog input signal node.

* * * * *